United States Patent [19]

Brünner

[11] 4,367,415

[45] Jan. 4, 1983

[54] PULSE GENERATOR CIRCUIT

[75] Inventor: Peter Brünner, Weil der Stadt, Fed. Rep. of Germany

[73] Assignee: Hewlett-Packard GmbH, Boeblingen, Fed. Rep. of Germany

[21] Appl. No.: 293,650

[22] Filed: Aug. 17, 1981

[30] Foreign Application Priority Data

Feb. 24, 1979 [DE] Fed. Rep. of Germany ..... 2907307

Related U.S. Application Data

[63] Continuation of Ser. No. 115,583, Jan. 25, 1980, abandoned.

[51] Int. Cl.$^3$ ............................................. H03K 3/64
[52] U.S. Cl. ..................................................... 307/106
[58] Field of Search ............. 307/106; 333/17 M, 124, 333/25, 32

[56] References Cited

U.S. PATENT DOCUMENTS

| | | | |
|---|---|---|---|
| 2,820,909 | 1/1958 | Plouffe | 307/106 |
| 3,176,237 | 3/1965 | Liger | 333/25 X |
| 3,383,526 | 5/1968 | Berding | 307/106 X |
| 3,612,899 | 10/1971 | Ross et al. | 307/106 |
| 3,660,675 | 5/1972 | Andrews | 307/106 X |

*Primary Examiner*—Donald A. Griffin
*Attorney, Agent, or Firm*—Stephen P. Fox

[57] ABSTRACT

A pulse generator circuit comprises a pulse source and an output line having a specific characteristic impedance and having an input and an output end, the output end being connectable to a high impedance external load and the input end being connectable to and disconnectable from said pulse source. An internal impedance being substantially equal to said characteristic impedance is provided and is connectable to and disconnectable from said input end of the output line. The input end of the output line can be alternatively connected to either the pulse source or to the internal impedance by a switching means. The switching means is controlled by control means in such a way that during delivery of pulses by said pulse source the pulse source is connected to said input end of the output line whereas said internal impedance is connected to the input end substantially during the intervals between the pulses.

2 Claims, 2 Drawing Figures

PULSE GENERATOR CIRCUIT

CROSS REFERENCE TO RELATED APPLICATION

This is a continuation of application Ser. No. 115,583, filed Jan. 25, 1980, now abandoned.

BACKGROUND OF THE INVENTION

If a pulse generator is connected to a load via a cable, reflections may arise at both ends of the cable causing a pulse to travel forwards and backwards on the cable. It is well known to avoid such reflections by terminating the cable by impedances equal to the characteristic impedance of the cable. This is the so-called matching condition. However, on the load side of the cable matching is not always possible or desirable. If, e.g. the impedance of the load is much bigger than the characteristic impedance of the cable, then there is substantially an open end condition causing a substantially complete reflection of an arriving pulse. That means that the pulse voltage is doubled at this end of the cable. This may be desirable if the load requires a higher voltage than can be delivered by the pulse generator.

Under such an open end condition, and also under any other mismatching condition at the load end of the cable a backwardly travelling pulse is generated which returns to the pulse generator at the other end of the cable. This returning pulse is not disadvantageous per se, however, further reflection at the pulse generator side of the cable must be avoided since it would then interfere with the pulse sequence at the load end of the cable. Therefore, typical output circuits of pulse generators meet the matching condition, i.e. the internal impedance of the pulse generator (or its output circuit) seen from the cable is equal to the characteristic impedance thereof. However, this means that on the input side of the cable one half of the pulse power is consumed by said internal impedance and cannot be used by the load on the other end of the cable.

In some other pulse generators the internal impedance can be switched off. However, this requires a matching condition at the load end of the cable in order to avoid reflections.

SUMMARY OF THE INVENTION

According to the invention a pulse generator circuit is provided which is capable of feeding substantially the full pulse power into a connection cable or a line leading to a load, even under mismatching conditions at the load end of the line. This is achieved by a switchable internal impedance which, under control of a control means, is connected to the cable only during the intervals between the pulses delivered from a pulse source. Thus, according to the invention, the internal impedance is not effective during delivery of a pulse to the line. Therefore, the full pulse power can be brought into the line. On the other hand, a pulse reflected from the load end of the line and returning at the pulse source end of the line during the interval between the pulses, is completely absorbed by the internal impedance.

DESCRIPTION OF THE PREFERRED EMBODIMENT

Figure 1:
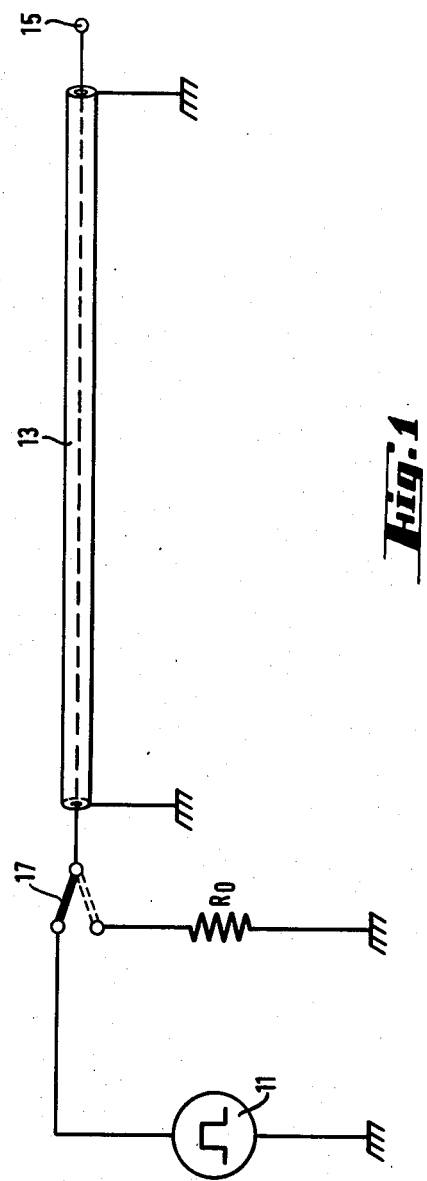
FIG. 1 schematically shows the basic principle of the invention.

FIG. 1 shows a pulse generator 11 which delivers via a coaxial cable 13 pulses to a terminal 15 which, e.g. can be connected to a load. For feeding each pulse from pulse generator 11 onto cable 13 a change-over switch 17 is brought into the position indicated by the solid line in FIG. 1. In this position a terminating impedance $R_0$ on the input side of the cable 13 (or the internal impedance of pulse generator 11 seen from cable 13) is switched off.

Immediately after feeding a pulse into cable 13 change-over switch 17 is brought into the position indicated by the dotted line in FIG. 1. In this position cable 13 is connected to impedance $R_0$. Now, if the pulse is completely or partly reflected at terminal 15, the returning pulse is absorbed by impedance $R_0$.

The principle of the invention is not limited to the scheme illustrated in FIG. 1. Instead of the transversal impedance $R_0$ also a serially connected impedance could be used which would be short-circuited during feeding of a pulse. In this case pulse generator 11 must be a low impedance voltage source. Moreover, it is arbitrary for the inventive principle whether the pulse generator 11 is a voltage or a current source. It is only necessary to arrange the terminating impedance $R_0$ as an internal impedance according to the well-known equivalent circuit diagrams. In all cases, however, it is necessary that during feeding of a pulse this impedance can be switched off in such a way that it does not consume any pulse power.

Of course, change-over switch 17 and its corresponding control circuitry must operate very quickly since the travelling time of a pulse on cable 13 is in the range of nano-seconds. However, this can be realized without difficulties by means of presently available semiconductor components. A practical embodiment of the invention is shown in FIG. 2.

Figure 2:
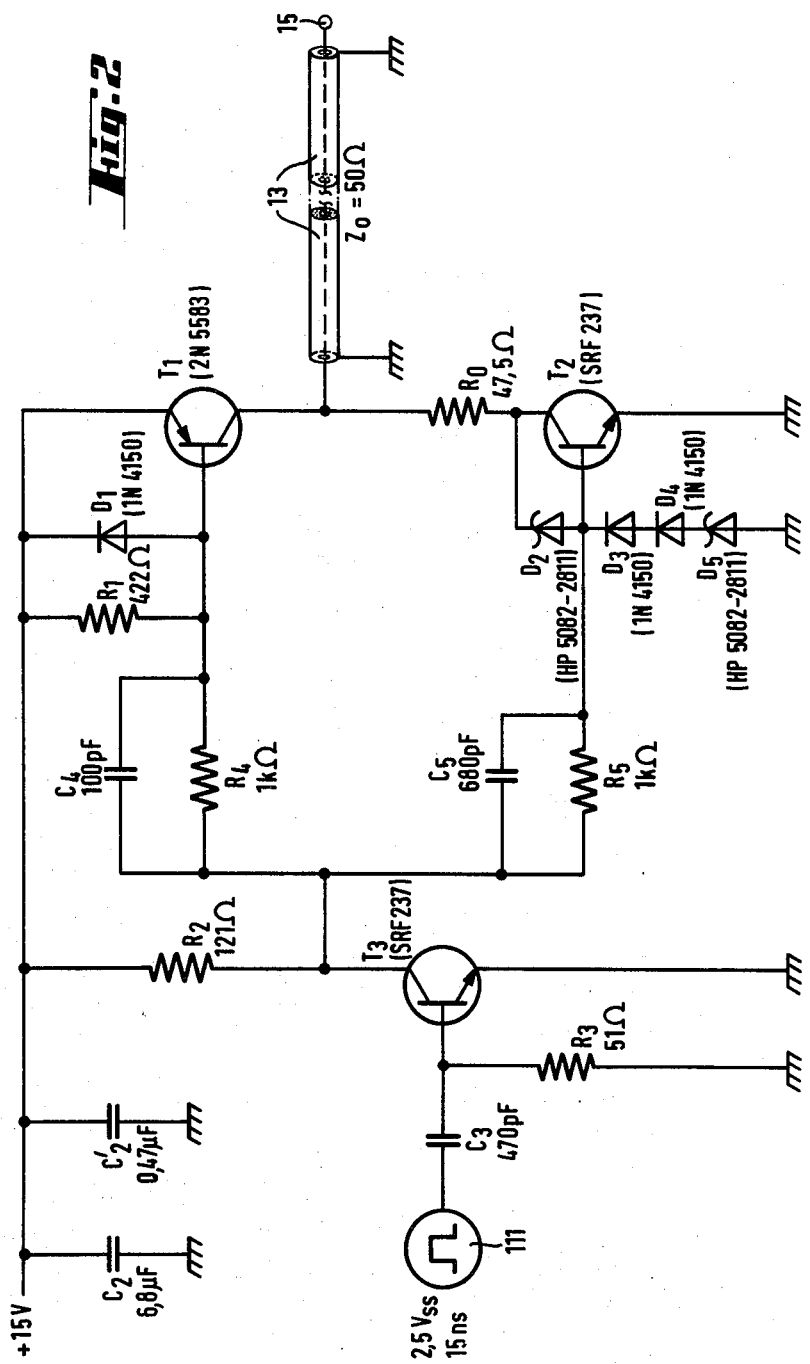
FIG. 2 is a detailed circuit diagram of a preferred embodiment of the invention.

In the circuit of FIG. 2 quick switching transistors $T_1$ and $T_2$ have the function of change-over switch 17 (FIG. 1). In the static state transistor $T_1$ is switched off, while transistor $T_2$ is conductive. Thus, the input side of cable 13 is terminated by resistor $R_0$.

For feeding a pulse into cable 13 transistor $T_1$ is rendered conductive while simultaneously transistor $T_2$ is switched off. Thus, cable 13 is connected to a supply voltage of +15 V. This operation is controlled by a pulse source 111. Since this source has only controlling purposes, its output voltage and its output power must not be so high as required on cable 13. E.g. the output voltage of pulse source 111 may be 2.5 V peak-to-peak with a pulse duration of 15 nsec.

Pulse source 111 drives the base of a transistor $T_3$ via an RC-circuit comprising a resistor $R_3$ and a capacitor $C_3$. Transistor $T_3$ which is connected to the supply voltage of +15 V via a collector resistor $R_2$, in turn drives transistors $T_1$ and $T_2$. For this purpose the collector of transistor $T_3$ is connected via a resistor $R_4$ and a capacitor $C_4$ connected in parallel, with the base of transistor $T_1$ and via a resistor $R_5$ and a capacitor $C_5$ connected in parallel, with the base of transistor $T_2$. Moreover, the base of transistor $T_1$ is connected to the supply voltage of +15 V via a resistor $R_1$.

The arrangement of the circuit of FIG. 2 is made so that, if transistor $T_3$ is switched off (static state), transistor $T_2$ is conductive and transistor $T_1$ is switched off. If pulse source 111 delivers a pulse to the base of transistor T3, then this transistor is rendered conductive which, in turn, renders transistor T1 conductive and switches off transistor T2. It can be seen that the true pulse generator for cable 13 is transistor T1. The appropriate pulse voltage is delivered by the voltage supply of +15 V while the conduction time of transistor T1 determines the pulse duration. The voltage supply of +15 V is preferably buffered by capacitors C2 and C2'.

A diode D1 protects the base/emitter diode of transistor T1 against breakdown. In a similar manner diodes D3, D4 and D5 protect the base/emitter diode of transistor T2. A diode D2 prevents transistor T2 from going into full saturation so that quick switching on of transistor T2 is possible.

In FIG. 2 practically appropriate values of resistors and capacitors as well as transistor and diode types are indicated. With a raise time of 6 nsec, a decay time of 7 nsec and a pulse width of 17 nsec a pulse amplitude of 28 V was measured across a load resistor of 5 k$\Omega$ at the end of a 4 meters long cable.

The length of cable 13 must have a distinctive ratio to pulse width and the interval between subsequent pulses. Regarding the pulse width it should be noted that the leading edge of the pulse reflected at terminal 15 may return at change-over switch 17 not earlier than the pulse from pulse generator 11 is completely fed into cable 13. Thus, the minimum cable length $l_{min}$ is:

$$l_{min} = t_w/2\rho$$

where $t_w$ is the pulse width and $\rho$ is the pulse travelling time per unit of length.

Regarding the maximum cable length $l_{max}$, it should be noted that a new pulse may be fed into the cable not before the reflected pulse is completely absorbed by the terminating impedance $R_0$. Hence $$l_{max} = T - t_w/2\rho$$

where T is the pulse distance (period duration).

I claim:

1. A pulse generator circuit comprising:
   a pulse source;
   an output line having a specific characteristic impedance and having an input end and an output end, the output end being connectable to a high impedance external load and the input end being connectable directly to and disconnectable from said pulse source;
   said output line having a minimum length, $l_{min} = t_w/2\rho$ and a maximum length, $l_{max} = T - t_w/2\rho$, where tw is the pulse width, T is the pulse period and $\rho$ is the pulse traveling time per unit of length of pulses produced by said pulse source;
   an internal impedance being substantially equal to said characteristic impedance and being connectable to and disconnectable from said input end of the output line;
   switching means for alternatively connecting said input end of the output line either directly to said pulse source or to said internal impedance; and
   control means for controlling said switching means to connect said pulse source to said input end of the output line during selected time intervals and to connect said input end to said internal impedance during the time between said intervals.

2. The pulse generator circuit according to claim 1 further comprising an auxiliary pulse source for triggering said control means in such a manner that said switching means produces pulses corresponding with regard to pulse width and pulse interval, to the pulses of said auxiliary pulse source.

* * * * *